United States Patent [19]

Coon et al.

[11] Patent Number: 5,030,831
[45] Date of Patent: Jul. 9, 1991

[54] METHOD OF OPERATING P-I-N DIODES AND SUPERLATTICE DEVICES AS FAR INFRARED DETECTORS

[75] Inventors: Darryl D. Coon; Robert P. Devaty; A. G. Unil Perera; Ralph E. Sherriff, all of Pittsburgh, Pa.

[73] Assignee: University of Pittsburgh, Pittsburgh, Pa.

[21] Appl. No.: 424,186

[22] Filed: Oct. 19, 1989

[51] Int. Cl.[5] .......................................... H01L 31/075
[52] U.S. Cl. .............................. 250/370.14; 250/338.4; 357/30
[58] Field of Search .................... 250/338.4, 370.14; 357/30 P

[56] References Cited

U.S. PATENT DOCUMENTS

| 4,166,218 | 8/1979 | Protic et al. | 250/370.14 |
| 4,568,960 | 2/1986 | Petroff et al. | 357/30 |
| 4,903,101 | 2/1990 | Maserjian | 357/30 |

FOREIGN PATENT DOCUMENTS

| 1539684 | 11/1969 | Fed. Rep. of Germany | 250/338.4 |
| 58-131526 | 8/1983 | Japan | 250/338.4 |

OTHER PUBLICATIONS

A. G. Kazanskii et al., "Far-Infrared Photoconductivity of Uniaxially Streed Germanium", *Applied Physics Letters*, vol. 31, No. 8, (Oct. 15, 1977), pp. 496–497.
Hajime Shirai et al., "Amplication of Photoconductive Gain with Space Charge Dopping Nini Multilayered Structure," *Japanese Journal of Applied Physics*, vol. 26, No. 12, (Dec. 1987), pp. L1937–L1940.
T. E. Jackman, et al., "Boron Redistribution in Doping Superlattices Grown by Silicon Molecular Beam Epitaxy Using $B_2O_3$", *Appl. Phys. Lett.*, 53(10), (Sep. 5, 1988), pp. 877–879.

*Primary Examiner*—Constantine Hannaher
*Attorney, Agent, or Firm*—Richard V. Westerhoff

[57] ABSTRACT

Far infrared light is detected using semiconductor devices having at least two doped layers with adjacent doped layers separated by undoped layers. The technique includes doping to levels which establish work functions at interfacial barriers between the doped and undoped layers approximately equal to the photon energy of far infrared light of the longest wavelength to be detected. The devices are forward biased, cooled to a temperature at which thermal excitation of carriers in the doped layers is less than the work function, and exposed to far infrared light of a band width including the selected longest wavelength. Photo current produced by excitation of carriers over the interfacial barriers is then measured. The method can be applied to existing p-i-n diodes and superlattice structures as well as devices fabricated to respond to specific far infrared wavelength bands.

20 Claims, 4 Drawing Sheets

METHOD OF OPERATING P-I-N DIODES AND SUPERLATTICE DEVICES AS FAR INFRARED DETECTORS

BACKGROUND OF THE INVENTION

1. Field of Invention

This invention relates to semiconductor light detectors and to operating such devices to detect far infrared light. In particular, it relates to operating p-i-n diodes and multi-layered semiconductor devices as far infrared detectors. The invention also relates to semiconductor devices constructed to operate efficiently as far infrared detectors at selected wavelengths.

2. Background Information

The p-i-n diode is widely used as a photodetector. It comprises a layer of n-type material and a layer of p-type material separated by an undoped layer of intrinsic semiconductor material. The p-i-n diode is normally operated in a reverse bias mode. That is, the positive pole of a bias voltage is applied to the n-layer and the negative pole to the p-layer. When operated in this mode, photons excite electrons in the valence band of the layer of intrinsic material to the conduction band through which they flow into the n-layer where they are withdrawn by the positive bias to produce a current in an external circuit. At the same time, holes in the conduction band are excited by photons to the valence band through which they flow into the p-layer to add to the current. Measurement of this current provides an indication of the intensity of the light impinging on the p-i-n diode. This transition from the valence band to the conduction band in the intrinsic layer requires a sizable amount of energy. For instance, in silicon, the usual base material from which p-i-n diodes are fabricated, the required energy is about 1.1 ev. This amount of energy must be available in the photons of the light to be detected. Thus, p-i-n diodes as conventionally operated can only detect light in the ultraviolet, visible and near infrared ranges where the photons have appropriate energies to excite electrons from the valence band to the conduction band in the intrinsic layer. They can not detect far infrared light where the photons have energies of about 45 mev or less. Normally, the p-i-n diode is operated at room temperature. This does not produce unacceptable noise levels because the reverse bias keeps thermionic currents to very low levels. Materials other than silicon have been used in p-i-n diodes to detect longer wavelength light. For instance, germanium p-i-n diodes require only about 0.7 ev for transitions between the valence and conduction bands. These devices are also conventionally operated with reverse bias.

Efforts have been made to extend the range of germanium photoconductive detectors into the far infrared region by applying mechanical stress to the devices. Detection of photons having an energy of about six mev has been reported using this technique.

Another type of device used to detect far infrared light is the blocked impurity band detector. These devices utilize an infrared (IR) active layer which is doped to produce a gap between Hubbard bands. This gap is on the order of the energy level of photons in the longer wavelength end of the far infrared range. A thin blocking layer of intrinsic semiconductor material is provided between the IR active layer and a contact layer of the same type semiconductor material as the IR active layer. The device is operated with reverse bias. Photons of far infrared light excite electrons from the lower Hubbard band across the gap to the upper Hubbard band which is contiguous with the conduction band of the IR active layer. The electrons excited to the upper Hubbard band thus flow through the conduction band to the contact layer. Such devices are operated at a low temperature where thermal generation of free charge carriers is negligible. An example of such a blocked impurity band detector is disclosed in U.S. Pat. No. 4,568,960.

Recently, work has been done with detectors made of a plurality of alternating layers of doped and undoped semiconductor materials. Such devices using n-type material for the doped layers are referred to as n-i-n-i structures while those with p-type material are called p-i-p-i structures. The n-i-n-i structures have been used to detect visible light where the photons have sufficient energy to excite electrons from the valence band to the conduction as in the case of conventional operation of p-i-n diodes.

There remains a need for a simple low cost technique for detecting far infrared light.

There is an associated need for being able to detect far infrared light using currently available semiconductor devices such as p-i-n diodes.

There is a further need to be able to detect far infrared light without having to apply mechanical stress to the detector.

There is also a need for being able to easily select the wavelengths of far infrared light to be detected.

There is an additional need to increase the quantum efficiency of far infrared light detection.

SUMMARY OF THE INVENTION

These and other needs are satisfied by the invention which is directed to detecting far infrared light by selecting a semiconductor device having at least two doped layers separated by an undoped layer forming interfacial barriers with the doped layers. The doped layers are doped to have at the interfacial barrier work functions approximately equal to the energy of photons of far infrared light of a selected longest wavelength to be detected. The semiconductor device is forward biased, and cooled to below the temperature at which the thermal excitation energy of carriers in the doped layers is less than the work function. The device is then exposed to far infrared light including light of the selected longest wavelength, and the current produced by carriers excited by photons over the interfacial barriers and accelerated by the forward bias is measured.

The invention can be applied to expand the use of existing p-i-n diodes to the detection of far infrared light. It can also be used to operate n-i-n-i and p-i-p-i structures to detect far infrared light. The doping levels of such devices can be adjusted in accordance with the invention to make the devices responsive to particular ranges of far infrared light frequencies. Also, in accordance with the invention, the doped layers of these devices can be made no thicker than about three times the relaxation distance of electrons in the doped layers, since electrons excited by photons at greater distances from the interfacial barriers have little likelihood of escaping over the barrier. The multi-layered structures enhance the quantum efficiency of far infrared detection practiced in accordance with the invention.

DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENTS

Figure 1:
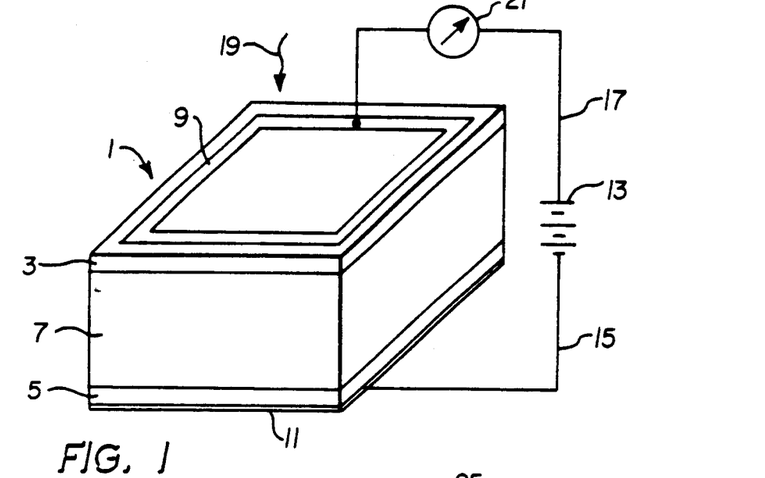
FIG. 1 is an isometric, partially schematic view of a p-i-n diode operated in accordance with the invention.

FIG. 1 illustrates a conventional p-i-n diode 1 operated in accordance with the invention. The p-i-n diode 1 includes a p-layer 3 and an n-layer 5 separated by an intrinsic layer 7. The relative dimensions of the layers are exaggerated in the figure for clarity. In a typical p-i-n diode, the doped layers 3 and 5 are about 0.2 to 3 microns thick and the intrinsic layer 7 has a thickness of about 100 to 250 microns. The p-i-n diode used in the exemplary embodiment of the invention was about 1 mm square. All three layers, 3, 5 and 7 are made of the same semiconductor material, commonly silicon. The p-layer 3 of silicon is heavily doped for instance to $3 \times 10^{18}$ cm$^{-3}$ with acceptor impurities, such as for example boron, and the n-layer 5 is heavily doped to the same degree with donor impurities, such as for example phosphorus. The intrinsic layer is undoped, meaning that it has impurities with a concentration of less than about $3 \times 10^{14}$ cm$^{-3}$. A contact 9 is formed on the transparent p-layer 3 by a rectangular aluminum band. The n-layer 5 is covered with a metalization layer 11 which forms the second electrical contact.

In accordance with the invention, the p-i-n diode 1 is forward biased by a dc voltage source 13 by connecting the negative terminal of the source 13 to the n-layer 5 through lead 15 and connecting the positive terminal to the p-layer 3 through lead 17.

Light 19 to be detected penetrates the p-i-n diode 1 through the p-layer 3 and is absorbed. Electric current induced by light 19 in the far infrared range is measured by current measuring device 21.

Figure 2:
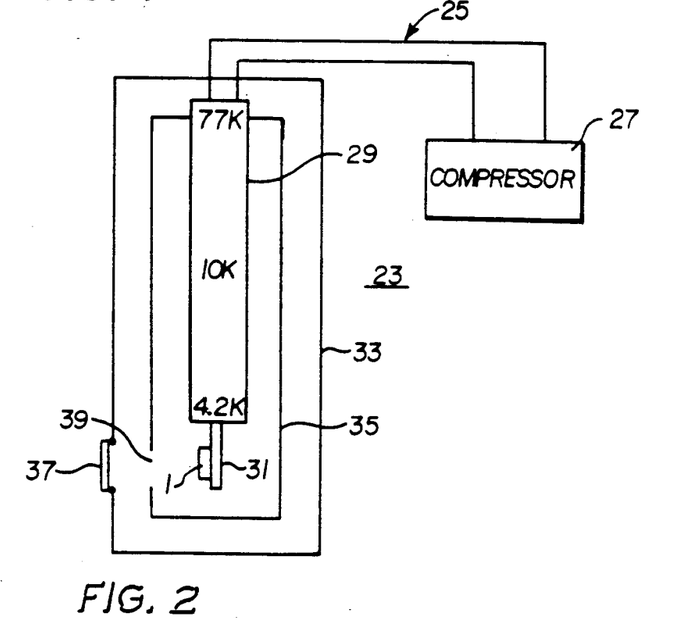
FIG. 2 is a schematic diagram of apparatus for utilization of the invention.

In order to operate the p-i-n diode 1 with forward bias without a large dark current, the diode is cooled in the apparatus 23 depicted schematically in FIG. 2. The apparatus 23 includes helium refrigerator 25 having compressor section 27 and a three stage evaporator section 29. The first stage at the upper end of the three stage evaporator section 29 is cooled to about 77K. while the second stage in the center section reaches about 10K and the third stage at the lower end goes down to the temperature of about 4.2K. The p-i-n diode 1 is attached to a thermal finger 31 extending from the third stage of the evaporator section 29. A shroud 33 encloses the evaporator section 29, the thermal finger 31 and the p-i-n diode 1. A radiation shield 35 inside the shroud 33 is in contact with, and therefore is cooled to about 77K by the first stage of the three stage evaporator 29 to shield the p-i-n diode 1 from infrared radiation emitted by the shroud 33 which is at room temperature. The entire space inside the shroud 33 is evacuated to reduce thermal conduction. A window 37 transparent to light of the selected wavelength is provided in the shroud 33 to admit light from the desired source which passes through an aperture 39 in the radiation shield 35 to the p-i-n diode 1. The helium refrigerator 25 is regulated to cool the p-i-n diode below the temperature for thermal excitation over interfacial barriers.

Figure 3:
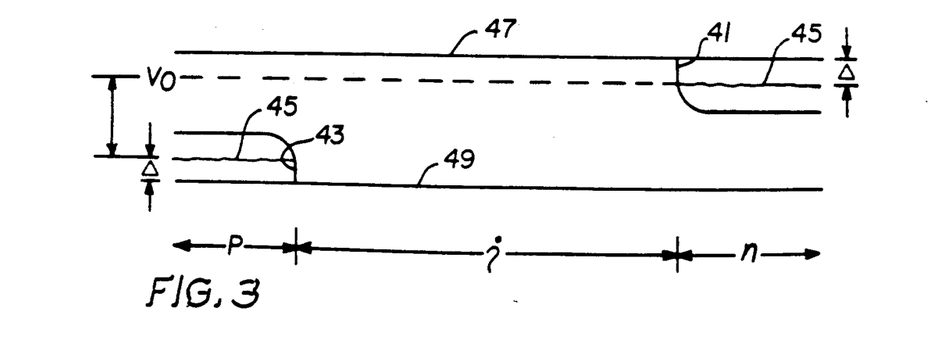
FIG. 3 is an energy band diagram of the diode of FIG. 1 with flatband bias voltage applied.
Figure 4:
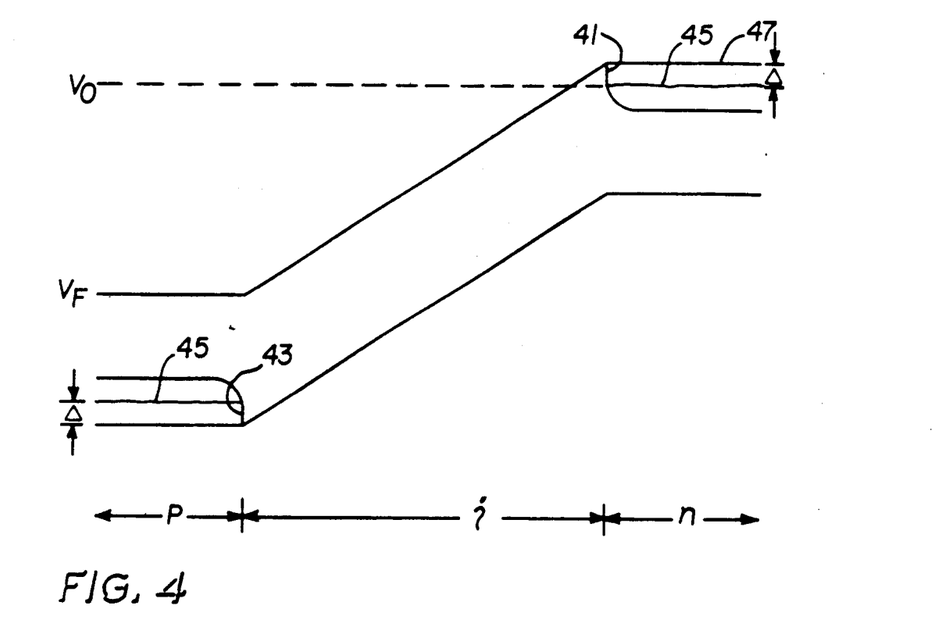
FIG. 4 is the energy band diagram of the diode of FIG. 1 with forward bias applied.

The mode of operation of the p-i-n diode 1 in accordance with the invention can be understood by reference to the energy band diagrams of FIGS. 3 and 4. FIG. 3 illustrates the energy band diagram for a flatband biased p-i-n diode. As can be seen, interfacial barriers 41 and 43 are formed at the interfaces between the p-layer 3 and intrinsic layer 7, and the n-layer 5 and the intrinsic layer 7, respectively. The p-layer 3 and n-layer 5 are heavily doped so that they are at about to slightly above the metal insulator transition. The doping is such that the Fermi levels 45 are spaced from the conduction band 47 in the n-layer, and from the valence band 49 in the p-layer by an amount of about $\Delta$. This amount of energy $\Delta$ represents the work function required to excite electrons from the Fermi sea in the n-layer to the conduction band 47 and to excite holes from the Fermi sea in the p-layer to the valence band 49.

FIG. 3 illustrates the energy band diagram with flatband bias voltage applied to the p-i-n diode. The flatband voltage $V_0$ is the difference between the Fermi levels 45 in the n- and p-layers. For silicon, this is about 1.1 ev. When a bias voltage is applied to the p-i-n diode, the conduction band 47 and valance band 49 in the intrinsic layer 7 are tilted. FIG. 4 illustrates the energy band diagram for a forward biased p-i-n diode. By forward biased, it is meant that the negative potential is applied to the n-layer 3 to inject electrons into this region and the voltage, $V_F$, is above the flatband voltage. It can be appreciated that with this bias condition, electrons which can be excited over the barrier 41 will be accelerated by the forward bias through the conduction band of the intrinsic layer 7 and fall into the p-layer. Similarly, holes in the p-layer will be excited under the barrier 43, accelerate along the valence band of the intrinsic layer due to the forward bias and rise into the n-layer. The electrons and holes are excited over and under the respective barriers by photons having energy levels approximately equal to the work function $\Delta$. This work function $\Delta$ can be adjusted through appropriate selection of the intrinsic material and doping material used, and the level of doping to make the p-i-n diode responsive to light over a range of wavelengths. The available ranges of $\Delta$ extend well into the far infrared. Typically, at the low end $\Delta$s of a few meV can be achieved.

Because of the small energy levels of the work function Δ, electrons can be excited over the barrier 41 by thermal excitation at room temperature. Under conventional operation of a p-i-n diode, these electrons fall back into the Fermi sea due to the application of reverse bias. However, with forward bias applied such thermal excitation would result in a very large dark current. Hence, in accordance with the invention, the p-i-n diode is cooled to a sufficiently low temperature at which thermionic current is essentially cut off.

The phenomena induced by the invention are analogous to those operative in photo responsive vacuum tubes. The n-i interfaces, such as 41, can be regarded as photocathodes, and the p-i interfaces, such as 43, can be considered photoanodes when the impurity concentrations are above the metal-insulator transition and the interface is forward biased.

Figure 5:
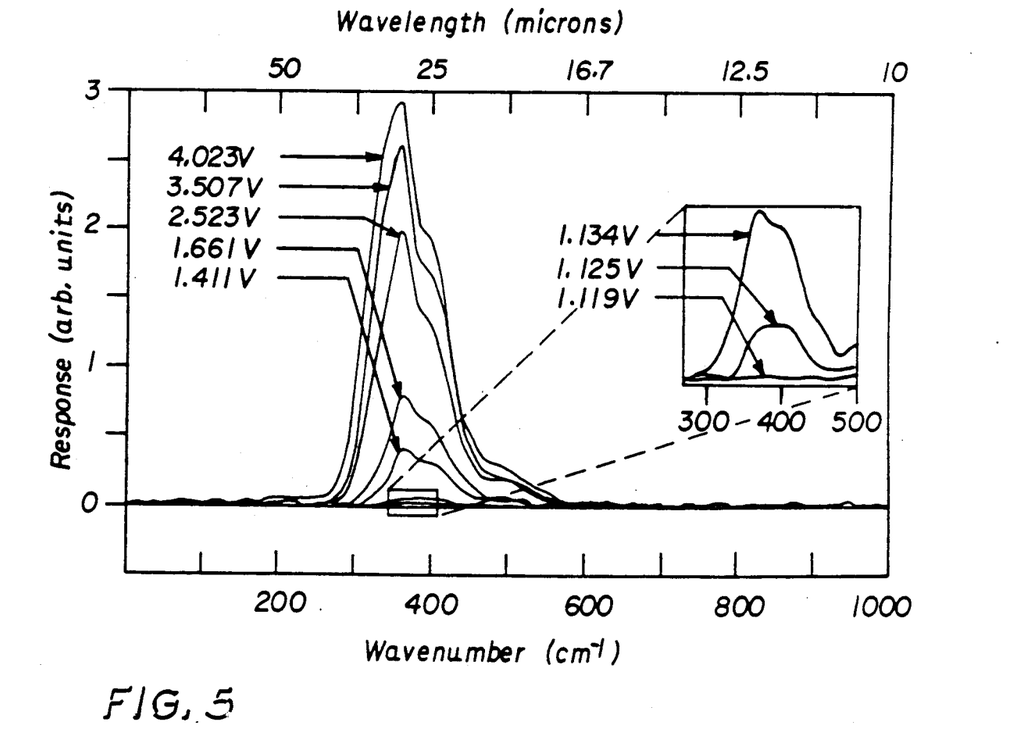
FIG. 5 is a diagram showing the response of one silicon p-i-n diode when operated in accordance with the invention incorporating an enlargement of a portion of the plot.

FIG. 5 illustrates the response of a first p-i-n diode to operation in accordance with the invention. A Motorola MRD 500 silicon p-i-n diode with boron as the acceptor impurity in the p-region and phosphorus as the donor impurity in the n-region was cooled to 4.2K. FIG. 5 illustrates the response for several values of bias voltage. The insert is an enlargement of a portion of the diagram indicated by the rectangle centered at a wavenumber of approximately 400 cm$^{-1}$. It can be seen from this figure that the cutoff wavelength corresponding to the photoelectric threshold is about 37±2 microns.

Figure 6:
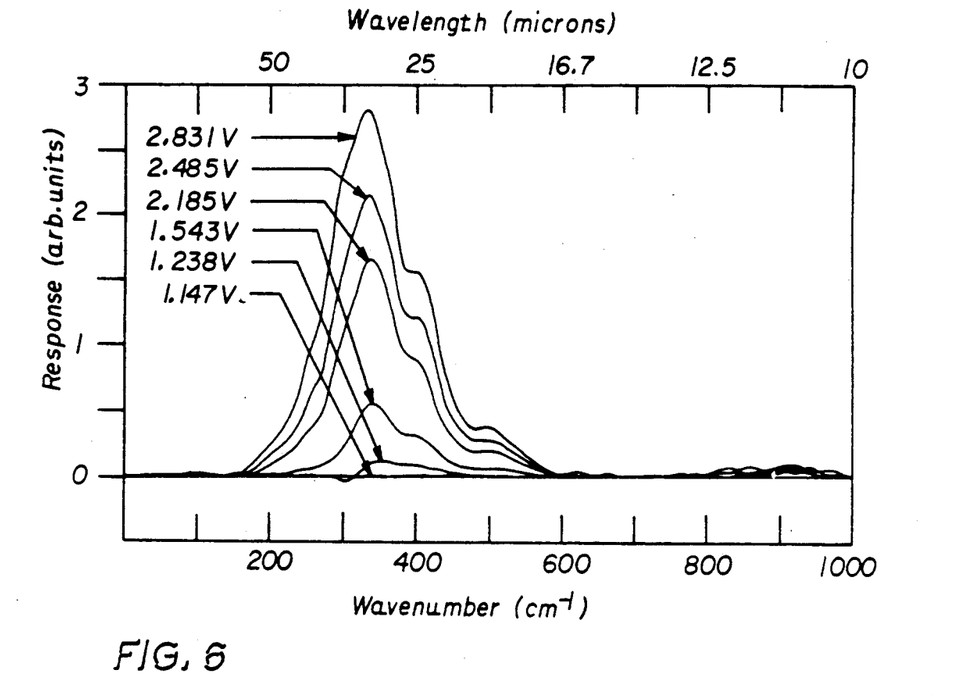
FIG. 6 is a diagram showing the response of another silicon p-i-n diode operated in accordance with the invention.

FIG. 6 illustrates the response to different forward bias voltages of a second p-i-n diode also operated in accordance with the invention. This is a Silicon Sensor MI 33H silicon diode also having boron and phosphorus as the impurities in the p- and n-layers, respectively. For this diode, the cutoff wavelength corresponding to the photoelectric threshold is about 61±2 microns.

Despite the forward bias applied to these p-i-n diodes, they do not pass appreciable dark current, because at 4.2K, the temperature is too low to cause much thermal excitation over the work function barrier Δ shown in FIG. 4. Under these conditions, the dark current at 5 volt bias was less than 100 atoamperes (<0.1 femtoamp) which represents the lower limit of our dc measurement capability. By contrast, currents up to 5 nA were observed under IR illumination provided by a high pressure mercury arc lamp.

Figure 7:
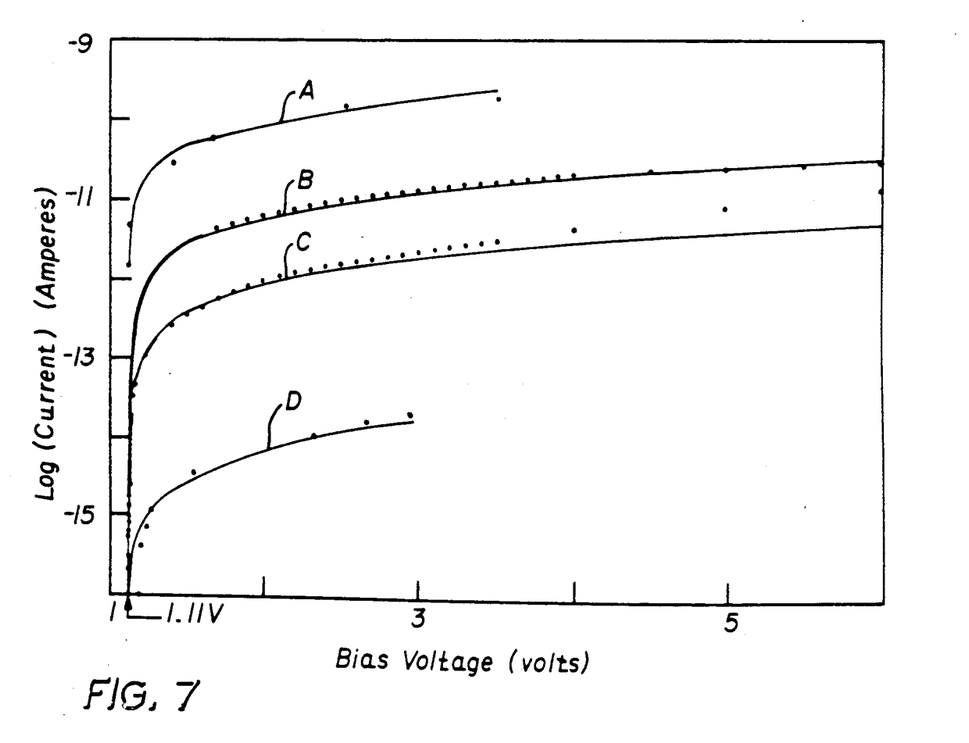
FIG. 7 is a multitrace diagram illustrating the photoelectric effect interpretation of the operation of a p-i-n diode in accordance with the invention.

FIG. 7 illustrates the photoelectric effect interpretation of operation of the first p-i-n diode in accordance with the invention. Trace A illustrates the modulated mercury arc photo current with the first diode at 4.2K and corresponds to the results in FIG. 5. Trace B is 300K background photocurrent with the first diode at 4.2K. Trace C is the filtered (greater than 28 microns) 300K background photocurrent with the first diode at 4.2K. Finally, trace D is thermionic dark current with the first diode at 16K. The dark current at 4.2K is less than 10$^{-16}$ amperes. The dots in FIG. 7 represent experimental points. The lines correspond to the following empirically derived formula for the current:

$$i = G(V - V_0)$$

where V is the bias voltage, $V_0$ is the flatband voltage and G is a temperature-dependent, intensity-dependent conductance. The filtered IR response curve (trace C in FIG. 7) shows some deviation from the above empirical formula. Since FIG. 7 shows the response to near threshold photons, the results may be associated with the effect of the applied field on the threshold. Lowering of the threshold could account for excess current at higher field strengths. In any event, the above equation is useful in the process of extrapolating photocurrent to i=0 in order to determine the flatband voltage $V_0$. A flatband voltage of 1.11±0.01 V was found for the first diode using the above equation and spectral data from FIG. 5 to extrapolate from a few picoamperes to zero current. This result is in good agreement with the more precise flatband voltage of 1.110±0.002 V determined from dc current measurements down to 100 atoamperes and the above equation.

None of the measurements made permitted us to determine whether the charge carriers are electrons or holes. However, if we call $\Delta_e$ the electron work function and $\Delta_h$ the hole work function, we can relate these work functions to the band gap, $E_{gap} = 1.170$ eV at 4.2K and the flatband voltage $V_0$. That is: $E_{gap} = eV_0 + \Delta_e + \Delta_h$ so that a measurement of $V_0$ and one work function will permit the other work function to be determined. The cited value of $E_{gap}$ includes exciton and phonon corrections. Spectral measurements reveal the lower of the two work functions. The larger work function is masked, but it can be determined from the equation for $E_{gap}$. In the case of the first diode, we found $\Delta_e \doteq \Delta_h$.

Figure 8:
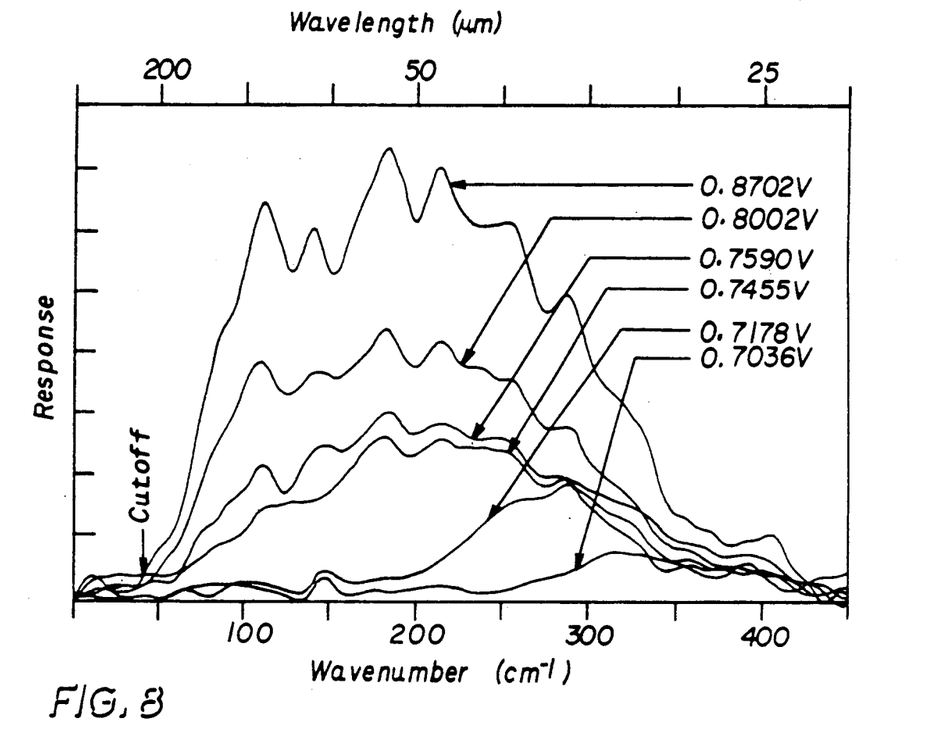
FIG. 8 is a diagram illustrating the response of a germanium p-i-n diode operated in accordance with the invention.

Theoretical calculations of Fermi levels in GaAs contact layers adapted to the case of silicon contact layers indicate that as impurity concentrations are increased in the neighborhood of the metal-insulator transition (3.74±0.1×10$^{18}$ cm$^{-3}$ for Si:P), donor impurity band Fermi levels will approach the conduction band edge and acceptor impurity band Fermi levels will approach the valence band edge. In other words, the work function Δ is a function of the impurity concentration (n) with a zero near, but generally slightly above, the metal insulator transition. Hence, we expect that interfacial work functions could be made arbitrarily small simply by increasing n- or p-layer doping. This could provide a wide range of response. For example, one might use Si:P cathodes out to wavelengths of about 130 microns; i.e., significantly beyond the expected cutoff of 27 microns, (45 meV) and to use doped germanium photo cathodes well beyond the expected cutoff of 130 microns (9.6 meV) for Ge:B. In fact, FIG. 8 illustrates the response of a germanium p-i-n diode Fujitsu FID 13R13TX having a Ge:In p-layer and a Ge:As n-layer operated at 4.2K and with a flatband voltage of 0.7 V. As can be seen, the diode has a cutoff of about 200 microns.

This extension of wavelength cutoffs could be applied to other impurities. For example, Si:In devices might be shifted to the 10-12 micron range and Si:Ga devices to the 18-22 micron range.

Figure 9:
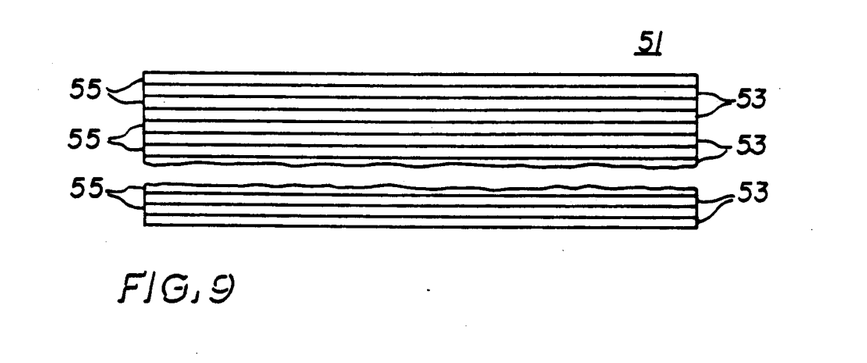
FIG. 9 illustrates a device having a superlattice structure operated in accordance with the invention.
Figure 10:
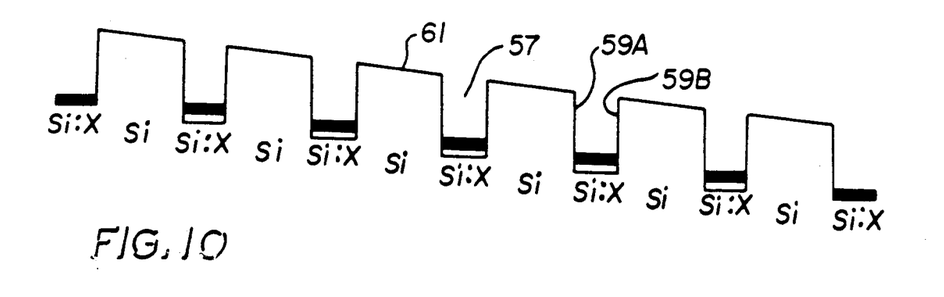
FIG. 10 is an energy band diagram for the device of FIG. 9 when operated in accordance with the invention.

The invention can also be applied to multi-layered devices such as n-i-n-i . . . and p-i-p-i . . . superlattices. FIG. 9 illustrates such a multi-layered device 51 with alternating intrinsic layers 53 and doped layers 55 with the doping being either donor or acceptor impurities in a given device. An energy band diagram for such a device in which the intrinsic material is silicon is shown in FIG. 10 where the impurity X is a donor impurity. The impurity in one of the terminal doped layers could be of the opposite type. These devices have a series of wells 57 formed by interfacial barriers 59A and 59B between the doped and intrinsic layers. As indicated by the slope of the conduction band 61 in this energy diagram, a bias voltage is applied which forward biases the barriers 59B. Accordingly, these devices are also operated at a temperature below that at which thermionic current is essentially cut off. The fact that the other barriers 59A of the wells 57 are reverse biased is of no consequence since electrons excited over the barriers 59B will be accelerated by the forward bias through the conduction band 61 to the terminal layer.

These n-i-n-i . . . and p-i-p-i . . . superlattice structures are readily fabricated with current methods of epitaxial growth such as molecular beam epitaxy and chemical vapor deposition. Such fabrication techniques produce devices with quite uniformly doped layers and very sharp interfaces. They also provide the capability of making very thin doped layers. This is very useful, since as mentioned, it is expected that excitation of electrons at distances greatly in excess of the relaxation distance of the electrons will produce little photocurrent. This relaxation distance is on the order of 100 Å and is material and voltage dependent, thus doped layers of about three times this distance or about 300 Å would be suitable. The multi-layered structure would thus significantly increase the response of these devices. The intrinsic layers should be thick enough to prevent interlayer tunneling in order to achieve low dark currents.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and an and all equivalents thereof.

What is claimed is:

1. A method of detecting far infrared light, comprising:
   selecting, a semiconductor device having at least two doped layers separated by an undoped layer forming interfacial energy barriers with said doped layers and doping said doped layers to have at said interfacial barriers work functions approximately equal to the energy of photons of far infrared light of a selected longest wavelength to be detected,
   forward biasing said semiconductor device,
   cooling said semiconductor device to below a temperature at which thermal excitation of carriers in the doped layers is less than said work function,
   exposing said semiconductor device to far infrared light containing light of said selected longest wavelength, and
   measuring current produced by carriers excited by photons of far infrared light containing light of said selected longest wavelength over said interfacial barriers and accelerated through said undoped region by said forward bias.

2. The method of claim 1 wherein said semiconductor device has one of said doped layers doped with donor impurities to form n-type material and the other doped layer is doped with acceptor impurities to form p-type material, and wherein said bias is applied with negative potential applied to the doped layer of n-type material.

3. The method of claim 2 including forming said doped layers to a thickness not greater than about three times a relaxation distance of electrons excited by photons of the selected longest wavelength of far infrared light.

4. The method of claim 2 including making said layers of silicon and wherein said semiconductor device is cooled to at least as low as about 16 degrees Kelvin.

5. The method of claim 4 wherein said semiconductor device is cooled to at least about 4.2 degrees Kelvin.

6. The method of claim 4 including forming all of said doped layers to a thickness about equal to the relaxation distance of electrons excited by photons of far infrared light of said selected longest wavelength.

7. The method of claim 1 including forming said semiconductor device of a plurality of alternating doped and undoped layers with at least all the doped layers but one terminal layer being doped with the same type of impurities.

8. The method of claim 7 wherein all the doped layers but said one terminal layer are doped with donor type impurities and said one terminal layer is doped with acceptor type impurities.

9. The method of claim 7 wherein all of said doped layers are doped with the same type of impurities.

10. The method of claim 9 wherein all of said doped layers are doped with donor type impurities.

11. The method of claim 9 including doping all of the doped layers with acceptor type impurities.

12. The method of claim 7 including forming all of said doped layers to a thickness not substantially greater than about three times a relaxation distance of electrons excited by photons of far infrared light of said selected longest wavelength.

13. The method of claim 11 including forming said undoped layers to a thickness at which electrons in said doped layers cannot tunnel through said undoped layers.

14. The method of claim 1 including adjusting doping levels of said doped layers to establish work functions approximately equal to the energy of photons of a particular longest wavelength of far infrared light.

15. A method of operating as a detector of far infrared light a p-i-n diode having a first doped layer of p-type material and a second doped layer of n-type material separated by an undoped layer of intrinsic material forming interfacial barriers with the doped layers, with the doped layers having work functions at said interfacial barriers approximately equal to the energy of photons of far infrared light of a selected longest wavelength to be detected, said method comprising the steps of:
   forward biasing said p-i-n diode with a negative potential applied to said second doped layer of n-type material,
   cooling said p-i-n diode to at least a temperature at which thermal excitation of carriers in the doped layers is less than said work function,
   exposing said p-i-n diode to far infrared light containing light of said selected longest wavelength, and
   measuring current produced by carriers excited by photons of far infrared light containing light of said selected longest wavelength over said interfacial barriers and accelerated through said undoped intrinsic layer by said forward bias.

16. A method of operating as a detector of far infrared light a semiconductor device having at least two doped layers separated by an undoped layer forming interfacial energy barriers with said doped layers, said doped layers being doped to have at said interfacial barriers work functions approximately equal to the energy of photons of far infrared light of a selected longest wavelength to be detected, said method comprising the steps of:

forward biasing said semiconductor device, cooling said semiconductor device to at least a temperature at which thermal excitation of carriers in the doped layers is less than said work function, exposing said semiconductor device to far infrared light containing light of said selected longest wavelength, and measuring current produced by carriers excited by photons of far infrared light containing light of said selected longest wavelength over said interfacial barriers and accelerated through said undoped region by said forward bias.

17. The method of claim 16 wherein said semiconductor device has one of said doped layers doped with donor impurities to form n-type material and the other doped layer is doped with acceptor impurities to form p-type material, and wherein said bias is applied with negative potential applied to the doped layer of n-type material.

18. The method of claim 16 wherein said semiconductor device comprises a plurality of alternating doped and undoped layers with at least all the doped layers but one terminal layer being doped with the same type of impurities.

19. The method of claim 18 wherein all of said doped layers are doped with the same type of impurities.

20. The method of claim 18 wherein said doped layers have a thickness at least as thin as about three times a relaxation distance of electrons excited by photons of far infrared light containing light of said selected longest wavelength.

* * * * *

UNITED STATES PATENT AND TRADEMARK OFFICE
CERTIFICATE OF CORRECTION

PATENT NO. : 5,030,831

DATED : July 9, 1991

INVENTOR(S) : DARRYL D. COON, ROBERT P. DEVATY, A. G. UNIL PERERA and RALPH E. SHERRIFF It is certified that error appears in the above-identified patent and that said Letters Patent is hereby corrected as shown below:

On the Title Page, after the title of the title of the invention, insert the following:

--This invention was made with government support under ECS-8814664 awarded by the National Science Foundation and SFRC No. N00014-85-K-0808 by the U.S. Department of Navy. The government has certain rights in the invention.--

Signed and Sealed this

Twenty-first Day of December, 1993

*Attest:*

BRUCE LEHMAN

*Attesting Officer*   *Commissioner of Patents and Trademarks*